US010114048B2

(12) United States Patent
Lopez Ramos et al.

(10) Patent No.: US 10,114,048 B2
(45) Date of Patent: Oct. 30, 2018

(54) DETECTION CIRCUIT

(71) Applicant: HEWLETT-PACKARD DEVELOPMENT COMPANY, L.P., Houston, TX (US)

(72) Inventors: Sergio Alejandro Lopez Ramos, Barcelona (ES); Juan Luis Lopez Rodriguez, Subirats (ES); David Soriano Fosas, Terrassa (ES)

(73) Assignee: Hewlett-Packard Development Company, L.P., Houston, TX (US)

( * ) Notice: Subject to any disclaimer, the term of this patent is extended or adjusted under 35 U.S.C. 154(b) by 21 days.

(21) Appl. No.: 15/522,683

(22) PCT Filed: Nov. 13, 2014

(86) PCT No.: PCT/US2014/065439
§ 371 (c)(1),
(2) Date: Apr. 27, 2017

(87) PCT Pub. No.: WO2016/076871
PCT Pub. Date: May 19, 2016

(65) Prior Publication Data
US 2017/0315161 A1 Nov. 2, 2017

(51) Int. Cl.
*G01R 17/02* (2006.01)
*G01R 19/165* (2006.01)
*G01R 31/12* (2006.01)

(52) U.S. Cl.
CPC ....... *G01R 19/16576* (2013.01); *G01R 17/02* (2013.01); *G01R 19/16571* (2013.01); *G01R 31/1236* (2013.01)

(58) Field of Classification Search
CPC ........ G01R 17/00; G01R 17/02; G01R 19/00; G01R 19/165; G01R 19/16566;
(Continued)

(56) References Cited

U.S. PATENT DOCUMENTS 3,581,150 A * 5/1971 Kirk ...................... H02H 7/067
322/28
3,789,242 A 1/1974 Cantor
(Continued)

FOREIGN PATENT DOCUMENTS

JP          2013162324         8/2013
KR     10-2011-0006518 A      1/2011

OTHER PUBLICATIONS

Ma, et al. A Monolithic Current-Mode Buck Converter With Advanced Control and Protection Circuits. Sep. 2007.
(Continued)

*Primary Examiner* — Hoai-An D Nguyen
(74) *Attorney, Agent, or Firm* — HP Inc. Patent Department

(57) ABSTRACT

Example implementations relate to circuits. For example, an implementation includes a detection circuit including a comparator circuit. The comparator circuit includes a first input terminal, a second input terminal, and an output terminal. The detection circuit also includes a reference voltage circuit to provide a set point voltage to the comparator circuit via the first input terminal. The detection circuit further includes a diode to reduce the set point voltage from a first magnitude to a second magnitude when the first magnitude is equal to or lower than a magnitude of the load voltage.

15 Claims, 5 Drawing Sheets

(58) Field of Classification Search
CPC ........ G01R 19/16571; G01R 19/16576; G01R 27/00; G01R 27/08; G01R 31/00; G01R 31/08; G01R 31/12; G01R 31/1227; G01R 31/1236; G05F 1/571; H02H 3/00; H02H 3/20; H02H 3/26; H02H 3/32; H02H 3/325; H02H 7/09; H02H 7/1252
USPC ....... 324/500, 512, 522, 537, 600, 602, 605, 324/606, 629, 647, 649, 691, 705, 713, 324/76.11, 98; 361/1, 88, 90, 91.1; 702/1, 57, 64

See application file for complete search history.

(56) References Cited

U.S. PATENT DOCUMENTS

| | | | |
|---|---|---|---|
| 3,816,809 A * | 6/1974 | Kuster | H02H 7/1213 |
| | | | 361/18 |
| 5,850,137 A | 12/1998 | Takimoto et al. | |
| 5,861,737 A | 1/1999 | Goerke et al. | |
| 8,427,069 B2 | 4/2013 | Wibben | |
| 2003/0030955 A1 | 2/2003 | Yamamura et al. | |
| 2010/0073034 A1* | 3/2010 | Valentino | G01R 19/16571 |
| | | | 327/77 |
| 2013/0235620 A1* | 9/2013 | Morris | H02M 3/335 |
| | | | 363/21.12 |
| 2014/0125253 A1* | 5/2014 | Chen | H05B 33/0809 |
| | | | 315/307 |

OTHER PUBLICATIONS

Wu, et al. Current-Mode Adaptively Hysteretic Control for Buck Converters with Fast Transient Response and Improved Output Regulation.

* cited by examiner

DETECTION CIRCUIT

BACKGROUND

An overvoltage is a condition where the magnitude of a voltage experienced by a circuit exceeds the operational parameter of the circuit. For example, an overvoltage may be caused by short circuiting part of the circuit. Components of a circuit may be damaged due to an occurrence of overvoltage at the circuit.

BRIEF DESCRIPTION OF THE DRAWINGS

Some examples of the present application are described with respect to the following figures.

DETAILED DESCRIPTION

As described above, components of a circuit may be damaged due to an occurrence of overvoltage at the circuit. When an overvoltage event occurs at a circuit, damages to components of the circuit may be reduced when the overvoltage event is detected and remedied as compared to not detecting the overvoltage event. Examples described herein provide a detection circuit to detect an overvoltage of a load circuit. For example, a detection circuit may include a comparator circuit. The comparator circuit may include a first input terminal and a second input terminal, where the second input terminal is to receive a load voltage from a load circuit. The comparator circuit may also include an output terminal. The detection circuit may also include a reference voltage circuit. The reference voltage circuit may provide a set point voltage to the comparator circuit via the first input terminal. The set point voltage may have a first magnitude. The reference voltage circuit may include a first resistor, a second resistor, and a capacitor.

The detection circuit may further include a diode to reduce the set point voltage from the first magnitude to a second magnitude when the first magnitude is equal to or lower than a magnitude of the load voltage. The diode may include an anode terminal and a cathode terminal. The anode terminal may be coupled to the first input terminal and the cathode terminal may be coupled to the reference voltage circuit via the second input terminal. In this manner, examples described herein may reduce a design complexity of a detection circuit.

Figure 1:
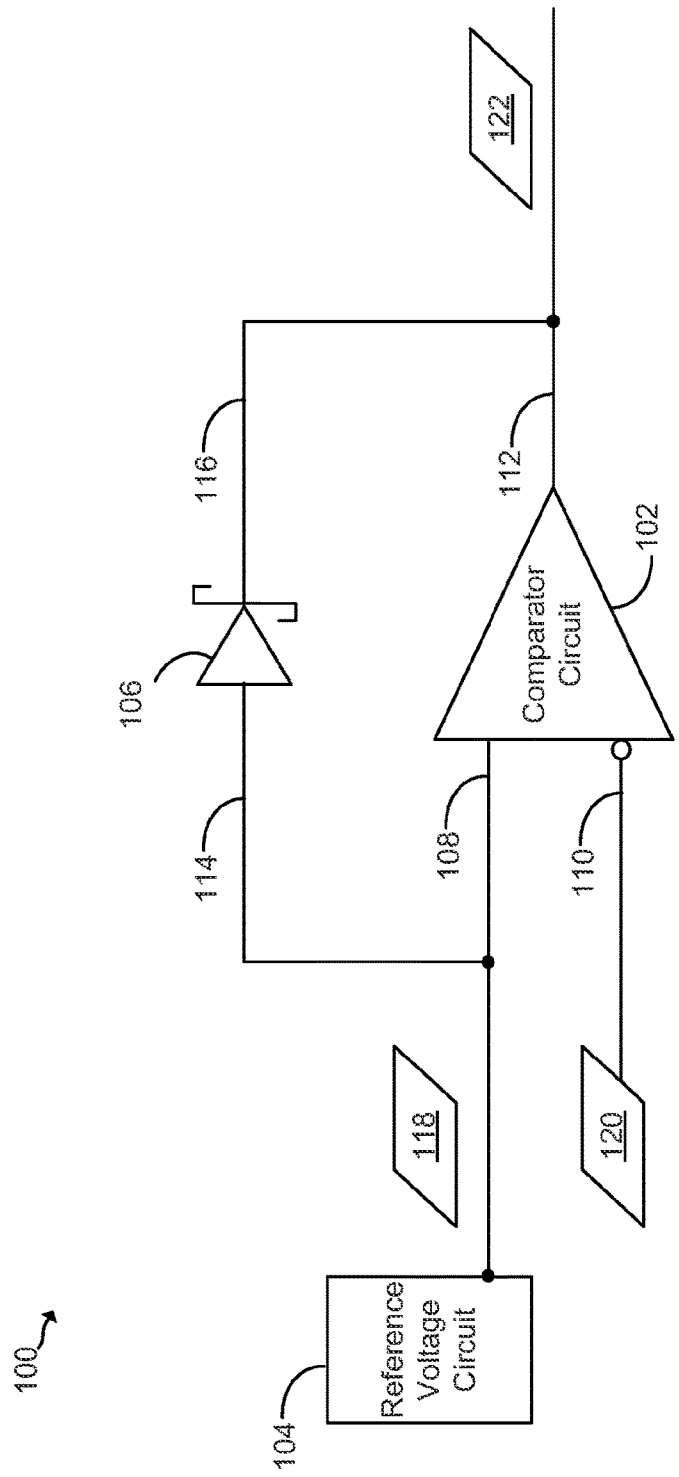
FIG. 1 is a block diagram of a detection circuit to sense an overvoltage of a circuit, according to an example.

Referring now to the figures, FIG. 1 is a block diagram of a detection circuit 100 to identify an overvoltage of a circuit, according to an example. Detection circuit 100 may be an electrical circuit that identifies an overvoltage event of a load circuit. Detection circuit 100 may include a comparator circuit 102, a reference voltage circuit 104, and a diode 106. Comparator circuit 102 may be a circuit that compares magnitudes of two input voltages and outputs a signal indicating the result of the comparison. Reference voltage circuit 104 may be a circuit that generates a voltage.

Comparator circuit 102 may include a first input terminal 108, a second input terminal 110, and an output terminal 112. In some examples, second input terminal 110 may be an inverting input terminal. Reference voltage circuit 104 may be a circuit that generates a voltage. An example of reference voltage circuit 104 is described in more detail in FIG. 2. Diode 106 may include an anode terminal 114 and a cathode terminal 116. Anode terminal 114 may be an electrode from which current may flow into diode 106. Cathode terminal 116 may be an electrode from which current may flow out of diode 106. Anode terminal 114 may be coupled to first input terminal 108 of comparator circuit 102. Cathode terminal 116 may be coupled to output terminal 112 of comparator circuit 102.

During operation, comparator circuit 102 may sense a set point voltage 118 generated by reference voltage circuit 104 via first input terminal 108. Comparator circuit 102 may sense a load voltage 120 via second input terminal 110. Load voltage 120 may be generated by a load circuit, as is described in more detail in FIG. 3. Load voltage 120 may correspond to an amount of current being drawn by the load circuit. Set point voltage 118 may have a magnitude that serves as a threshold for an amount of current to be drawn by the load circuit during operation. When the magnitude of set point voltage 118 is greater than the magnitude of load voltage 120, the load circuit may be operating within normal operational parameters of the load circuit. When the magnitude of set point voltage 118 is less than or equal to the magnitude of load voltage 120, the load circuit may be drawing an amount of current above the threshold. The overdrawing of current may indicate that the load circuit may be experiencing a malfunction, such as a short circuit event.

Comparator circuit 102 may output a comparison signal to indicate a result of comparison between set point voltage 118 and load voltage 120. For example, comparator circuit 102 may output the comparison signal by asserting an output voltage 122 at output terminal 112. The magnitude of output voltage 122 may correspond to the instantaneous value of the comparison. For example, when the magnitude of set point voltage 118 is greater than the magnitude of load voltage 120, output voltage 122 may have a first magnitude (e.g., a positive voltage). In some examples, the first magnitude may correspond to a maximum positive voltage that output voltage 122 may reach, such as the magnitude of a voltage source. The first magnitude may correspond to a high state of the comparison signal.

When the magnitude of set point voltage 118 is less than or equal to the magnitude of load voltage 120, output voltage 122 may have a second magnitude that is less than the first magnitude. In some examples, the second magnitude may correspond to zero volts. The second magnitude may correspond to a low state of the comparison signal.

Diode 106 may operate in different operation states based on the result of comparison between set point voltage 118 and load voltage 120. For example, diode 106 may operate in a reverse bias operation state when the magnitude of set point voltage 118 is greater than the magnitude of load voltage 120. During the reverse bias operation state, diode 106 may not conduct current.

Diode 106 may transition to operate in a forward bias operation state when the magnitude of load voltage 120 is greater than or equal to the magnitude of set point voltage 118. During the forward bias operation state, diode 106 may conduct current from anode terminal 114 to cathode terminal 116. By conducting current, diode 106 may generate a voltage drop to obtain a reduction of magnitude of set point voltage 118. For example, when diode 106 is in the forward bias operation state, a magnitude of set point voltage 118 may be reduced from a first magnitude (e.g., 3 volts) to a second magnitude (e.g., 0.2 volts).

By forcing the magnitude of set point voltage 118 to drop to the second magnitude via diode 106, the comparison signal of comparator circuit 102 may remain at the low state until the malfunction of the load circuit is remedied. When the malfunction of the load circuit is remedied, reference voltage circuit 104 may increase the magnitude of set point voltage 118 from the second magnitude back to the first magnitude at a rate that is independent of output voltage 122 as described in more detail in FIG. 2.

Figure 2:
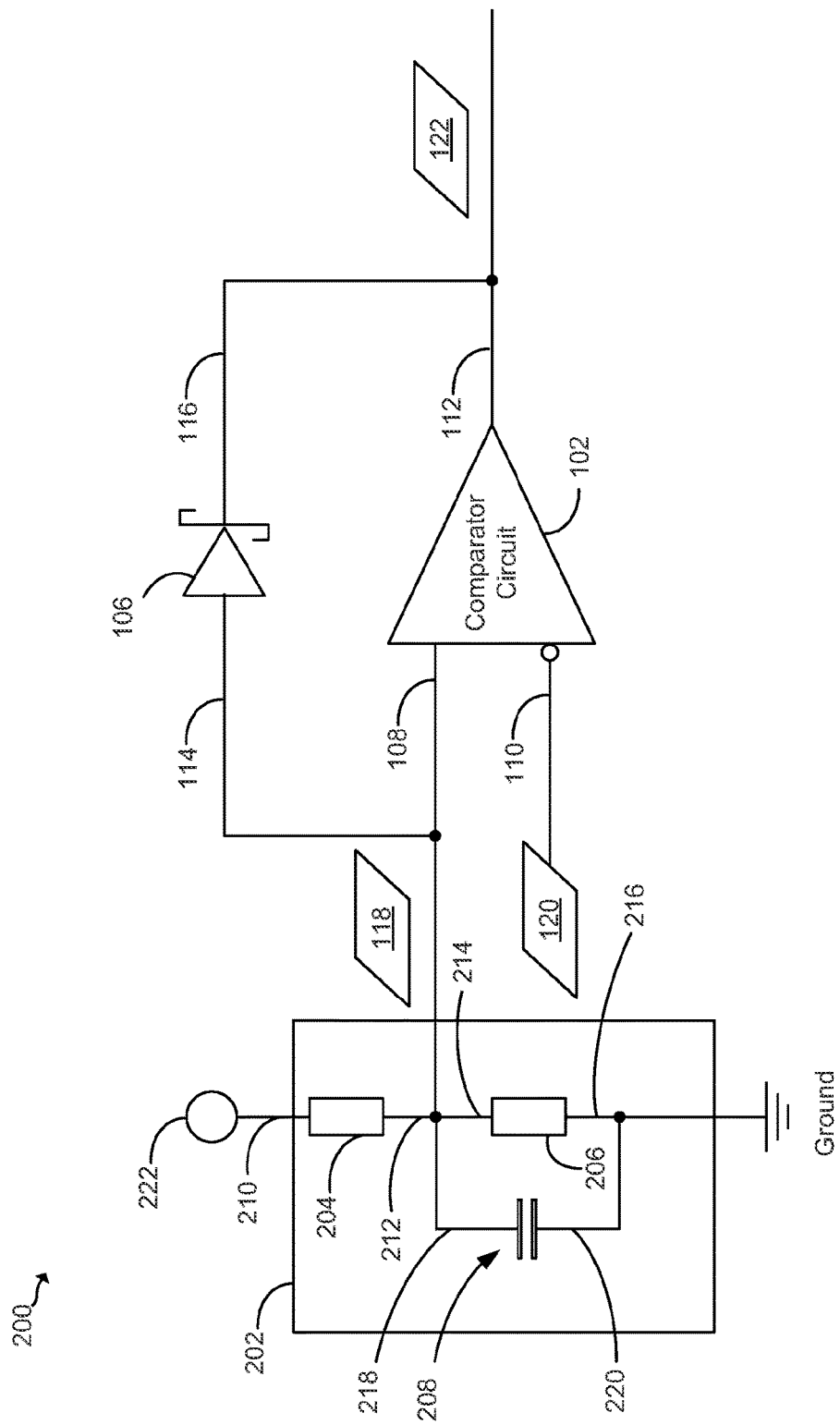
FIG. 2 is a block diagram of a detection circuit to sense an overvoltage of a circuit, according to another example.

FIG. 2 is a block diagram of a detection circuit 200 to sense an overvoltage of a circuit, according to another example. Detection circuit 200 may be similar to detection circuit 100 of FIG. 1. Detection circuit 200 may include comparator circuit 102, diode 106, and reference voltage circuit 202. Reference voltage circuit 202 may be similar to reference voltage circuit 104 of FIG. 1. Reference voltage circuit 202 may include a first resistor 204, a second resistor 206, and a capacitor 208. First resistor 204 may include a first terminal 210 and a second terminal 212. Second resistor 206 may include a third terminal 214 and a fourth terminal 216. Capacitor 208 may include a fifth terminal 218 and a sixth terminal 220.

First terminal 210 of first resistor 204 may be coupled to a voltage source 222. Second terminal 212 of first resistor 204 may be coupled to third terminal 214 of second resistor 206. Fourth terminal 216 of second resistor 206 may be coupled to ground. Thus, first resistor 204 and second resistor 206 may be coupled in series. Fifth terminal 218 of capacitor 208 may be coupled to second terminal 212 and to third terminal 214. Sixth terminal 220 of capacitor 208 may be coupled to fourth terminal 216. Thus, capacitor 208 may be coupled to second resistor 206 in parallel.

During operation, first resistor 204, second resistor 206, and capacitor 208 may determine a rate of change associated with the magnitude of set point voltage 118. For example, diode 106 may reduce the magnitude of set point voltage 118 from a first magnitude to a second magnitude when operating in the forward bias operation state. When diode 106 transitions back to the reverse bias operation state (e.g., when the magnitude of set point voltage 118 is greater than the magnitude of load voltage 120), current generated from voltage source 222 may begin charging capacitor 208. As the electrical energy in capacitor 208 begin to increase due to charging, the magnitude of set point voltage 118 may also begin to increase. The rate at which the magnitude of set point voltage 118 increases from the second magnitude to the first magnitude may be determined by equation (1):

$$\text{Rate}=((R1*R2)/(R1+R2))*C \qquad (1)$$

where R1 is the resistance value of first resistor 204;
R2 is the resistance value of second resistor 206; and
C is the capacitance value of capacitor 208.

As illustrated in equation (1), the rate may be equal to a product of two parts. One of the two parts corresponds to a ratio between a product of R1 and R2 and a sum of R1 and R2. The other of the two parts corresponds to C. The rate may be determined independent of output voltage 122. That is, the magnitude of output voltage 122 may not influence the rate at which the magnitude of set point voltage 118 increases from the second magnitude to the first magnitude because diode 106 may not conduct current generated by output voltage 122 from output terminal 112 to reference voltage circuit 202. Thus, the magnitude of output voltage 122 has no effect on how fast the magnitude of set point voltage 118 increases from the second magnitude to the first magnitude.

Figure 3:
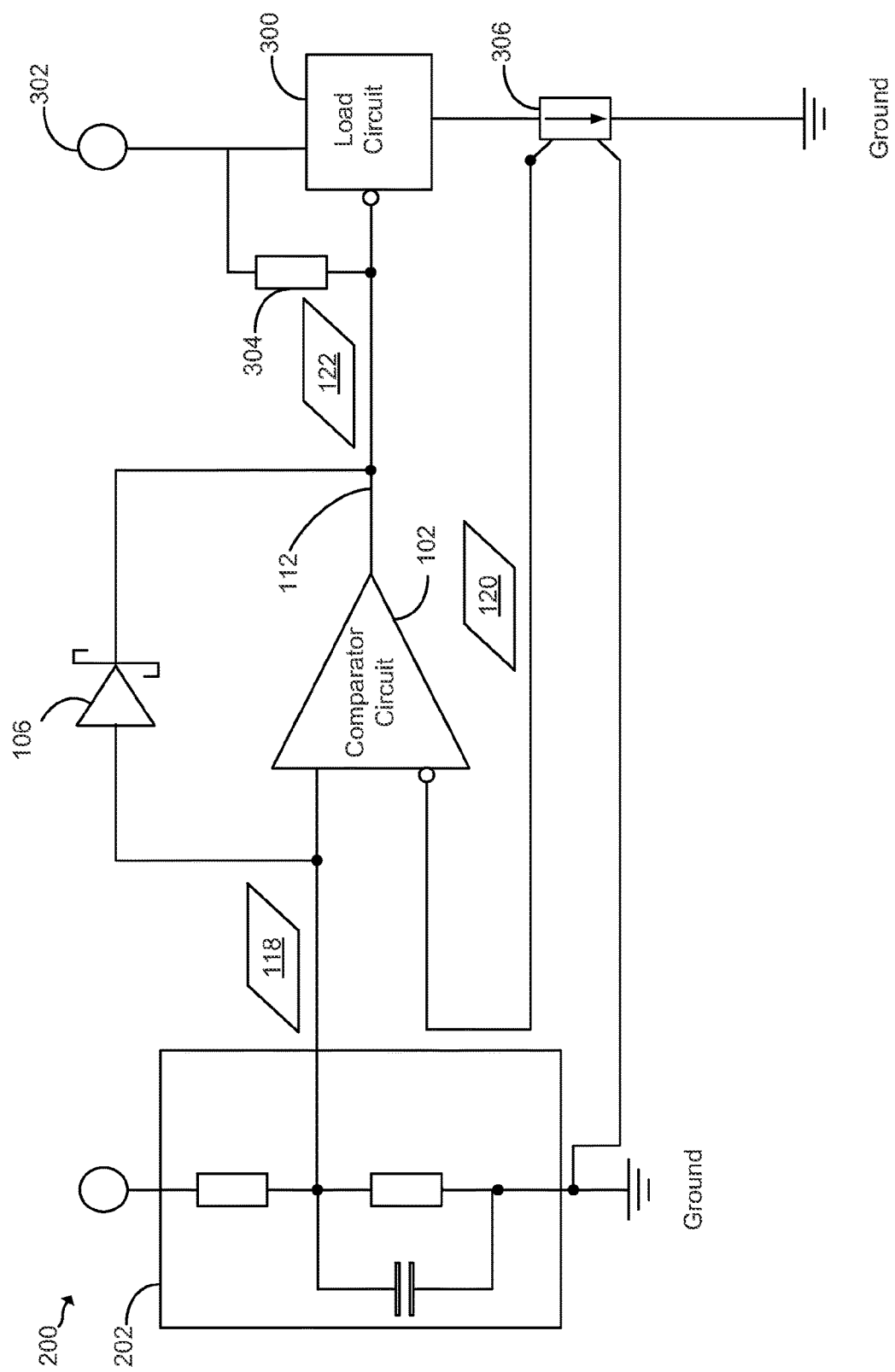
FIG. 3 is a block diagram of the detection circuit of FIG. 2 coupled to a load circuit, according to an example.

FIG. 3 is a block diagram of detection circuit 200 of FIG. 2 coupled to a load circuit 300, according to an example. Load circuit 300 may be any circuit that receives voltage and/or current to operate. Load circuit 300 may be powered by a voltage source 302 during operation. In some examples, a third resistor 304 may be coupled between voltage source 302 and output terminal 112. Third resistor 304 mat act as a pull-up resistor so that the magnitude of output voltage 122 may be at or close to the magnitude of voltage source 302 when the magnitude of set point voltage 118 is greater than the magnitude of load voltage 120. Also, the magnitude of output voltage 122 may be at zero volts when the magnitude of set point voltage 118 is less than or equal to than the magnitude of load voltage 120. In some examples, load circuit 300 may be coupled to a current-to-voltage (I/V) transducer 306. IN transducer 306 may sense the amount of current drawn by load circuit 300 and translate the amount of current drawn to load voltage 120.

Output terminal 112 of comparator circuit 102 may be coupled to load circuit 300 to determine and/or control an operation state of load circuit 300. For example, output voltage 122 may serve as a control signal to load circuit 300. When load circuit 300 is operating within normal operational parameters, the magnitude of load voltage 120 may be less than the magnitude of set point voltage 118. Comparator circuit 102 may assert output voltage 122 having a first magnitude, such as the magnitude of voltage source 302, to load circuit 300. Load circuit 300 may remain powered on based on output voltage 122 having the first magnitude.

When load circuit 300 has an overvoltage event, the magnitude of load voltage 120 may be greater than or equal to the magnitude of set point voltage 118. Comparator circuit 102 may assert output voltage 122 having a second magnitude, such as zero volts, to alert load circuit 300 until the overvoltage event is remedied. In some examples, output voltage 122 may be used to disable and/or shut down at least portion of load circuit 300.

Figure 4:
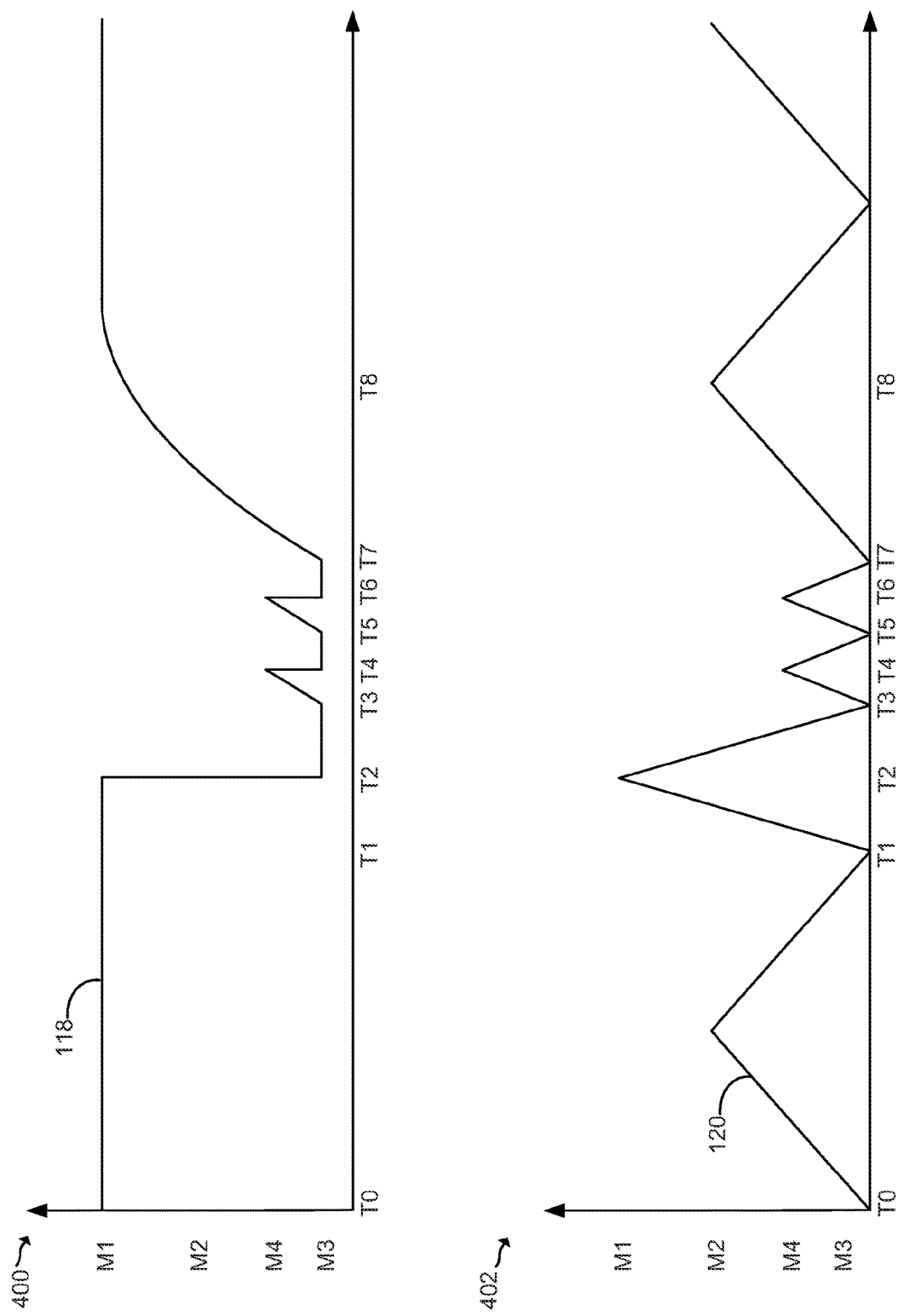
FIG. 4 illustrates changes in magnitude of a set point voltage of a detection circuit relative to changes in magnitude of a load voltage of the detection circuit, according to an example.

FIG. 4 illustrates changes in magnitude of a set point voltage of a detection circuit relative to changes in magnitude of a load voltage of the detection circuit, according to an example. Diagram 400 may correspond to changes in magnitude of set point voltage 118. Diagram 402 may correspond to changes in magnitude of load voltage 120. Diagrams 400 and 402 may correspond to changes in magnitudes of set point voltage 118 and load voltage 120 sensed by detection circuit 100, 200, and/or 300. For purpose of discussion, diagrams 400 and 402 are described with reference to detection circuit 200 of FIG. 3.

From time T0 to time T1, load circuit 300 may operate within normal operational parameters. Thus, the magnitude of load voltage 120 may be less than the magnitude of set point voltage 118. For example, the magnitude of set point voltage 118 may be M1. The magnitude of load voltage 120 may fluctuate between zero volts to M2 that is less that M1. The fluctuation in magnitude of load voltage 120 may correspond to a current consumption slope of load circuit 300.

At time T1, load circuit 300 may experience an overvoltage event (e.g., caused by a short circuit), the magnitude of load voltage 120 may begin to increase rapidly. At time T2, the magnitude of load voltage 120 may be equal to or greater than the magnitude of set point voltage 118 at M2. Thus, comparator circuit 102 may assert output voltage 122 having a particular magnitude, such as zero volts, to indicate that the magnitude of load voltage 120 may be equal to or greater than the magnitude of set point voltage 118. Based on output voltage 122, diode 106 may transition to the forward bias operation state to reduce the magnitude of set point voltage 118 from M1 to M3. In some examples, M3 may be less than M2. From time T2 to time T3, diode 106 may operate in the forward bias operation state to maintain output voltage 122 at the particular magnitude.

At time T3, the magnitude of load voltage 120 may be less than the magnitude of set point voltage 118 (e.g., due to load circuit 300 being disabled). Comparator circuit 102 may assert output voltage 122 having another particular magnitude, such as the magnitude of voltage source 302. Based on output voltage 122, diode 106 may transition to the reverse bias operation state. Reference voltage circuit 202 may increase the magnitude of set point voltage 118 from M3 towards M1.

At time T4, the magnitude of load voltage 120 may be increasing at a rapid rate so that the magnitude of load voltage 120 may be equal to or greater than the magnitude of set point voltage 118 at M4. In some examples, M4 may be greater than M3. For example, load circuit 300 may be powered on again when the magnitude of load voltage 120 drops below the magnitude of set point voltage 118. However, the overvoltage event is not remedied. Thus, the magnitude of load voltage 120 may be increasing at a rapid rate again. Comparator circuit 102 may assert output voltage 122 having the particular magnitude to again indicate the magnitude of load voltage 120 may be equal to or greater than the magnitude of set point voltage 118. The magnitude of set point voltage 118 may be reduced from M4 to M3.

Comparing to the change in magnitude of set point voltage 18 at time T2, comparator circuit 102 is triggered (i.e., change the magnitude of output voltage) when the magnitude of set point voltage 118 is at a lower level than M1 as reference voltage circuit 202 may not have enough time to increase the magnitude of set point voltage 118 from M3 back to M1. Thus, subsequent to an initial triggering of comparator circuit 102, as long as the magnitude of load voltage 120 is increasing at a rate that is greater than the magnitude of set point voltage 118, comparator circuit 102 may be triggered before the magnitude of set point voltage 118 reaches M1.

Similar to the time period between time T3 and time T4, at time T5, reference voltage circuit 202 may increase the magnitude of set point voltage 118 from M3 towards M1. At time T6, the magnitude of load voltage 120 may be equal to or greater than the magnitude of set point voltage 118. Thus, comparator circuit 102 may be again triggered and the magnitude of set point voltage 118 may be reduced from M4 to M3. From time T7 to time T8, the overvoltage event may be remedied. Thus, load voltage 120 may be increasing at a rate that is slower than set point voltage 118.

Figure 5:
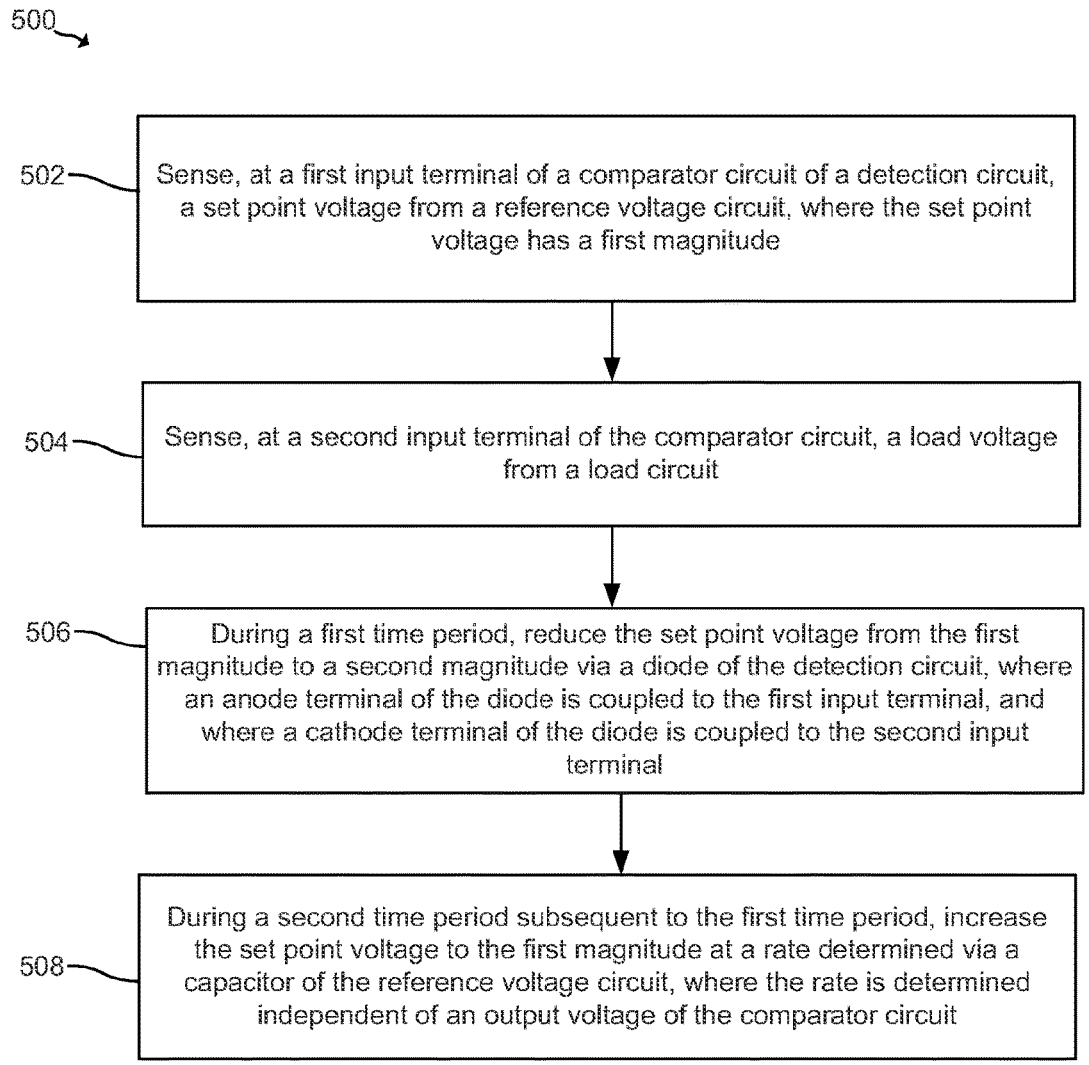
FIG. 5 is a flowchart illustrating a method of operation at a detection circuit, according to an example.

FIG. 5 is a flowchart illustrating a method 500 of operation at a detection circuit, according to an example. Method 500 may be implemented using detection circuit 100 of FIG. 1 and/or detection circuit 200 of FIGS. 2-3. Method 500 includes sensing, at a first input terminal of a comparator circuit of a detection circuit, a set point voltage from a reference voltage circuit, where the set point voltage has a first magnitude, at 502. For example, referring to FIG. 1, comparator circuit 102 may sense set point voltage 118 generated by reference voltage circuit 104 via first input terminal 108.

Method 500 also includes sensing, at a second input terminal of the comparator circuit, a load voltage from a load circuit, at 504. For example, referring to FIG. 1, comparator circuit 102 may sense a load voltage 120 via second input terminal 110.

Method 500 further includes during a first time period, reducing the set point voltage from the first magnitude to a second magnitude via a diode of the detection circuit, where an anode terminal of the diode is coupled to the first input terminal, and where a cathode terminal of the diode is coupled to the second input terminal, at 506. For example, referring to FIG. 4, the first time period may correspond to time T2, set point voltage 118 may be reduced from a first magnitude M1 to a second magnitude M2.

Method 500 further includes during a second time period subsequent to the first time period, increasing the set point voltage to the first magnitude at a rate determined via a capacitor of the reference voltage circuit, where the rate is determined independent of an output voltage of the comparator circuit, at 508. For example, referring to FIGS. 3-4, the second time period may correspond to a time period between time T3 to time T4, a time period between time T5 to time T6, and/or a time period between time T7 and time T8. Set point voltage 118 may be increasing at a rate determined by at least capacitor 208 of reference voltage circuit 202.

The use of "comprising", "including" or "having" are synonymous and variations thereof herein are meant to be inclusive or open-ended and do not exclude additional unrecited elements or method steps.

What is claimed is:

1. A detection circuit comprising:
  a comparator circuit including:
    a first input terminal;
    a second input terminal to receive a load voltage from a load circuit; and
    an output terminal;
  a reference voltage circuit to provide a set point voltage to the comparator circuit via the first input terminal, wherein the set point voltage has a first magnitude; and
  a diode to reduce the set point voltage from the first magnitude to a second magnitude when the first magnitude is equal to or lower than a magnitude of the load voltage, wherein the diode includes an anode terminal and a cathode terminal, wherein the anode terminal is coupled to the first input terminal, and wherein the cathode terminal is coupled to the reference voltage circuit via the second input terminal.

2. The detection circuit of claim 1, wherein the reference voltage circuit includes a first resistor, a second resistor coupled to the first resistor, and a capacitor coupled to the second resistor in parallel.

3. The detection circuit of claim 2, wherein subsequent to a reduction of magnitude of the set point voltage, when the second magnitude is greater than the magnitude of the load voltage, the reference voltage circuit to increase the set point voltage from the second magnitude to the first magnitude at a rate determined by the first resistor, the second resistor, and the capacitor.

4. The detection circuit of claim 1, wherein the diode is in a forward bias operation state when the load voltage is equal to or greater than the set point voltage, and wherein the diode is in a reverse bias operation state when the load voltage is less than the set point voltage.

5. The detection circuit of claim 1, the comparator circuit to assert an output voltage having a particular magnitude via the output terminal coupled to the load circuit, wherein an operation state of the load circuit is determined based on the output voltage.

6. A method comprising:
sensing, at a first input terminal of a comparator circuit of a detection circuit, a set point voltage from a reference voltage circuit, wherein the set point voltage has a first magnitude;
sensing, at a second input terminal of the comparator circuit, a load voltage from a load circuit;
during a first time period, reducing the set point voltage from the first magnitude to a second magnitude via a diode of the detection circuit, wherein an anode terminal of the diode is coupled to the first input terminal, and wherein a cathode terminal of the diode is coupled to the second input terminal; and
during a second time period subsequent to the first time period, increasing the set point voltage to the first magnitude at a rate determined via a capacitor of the reference voltage circuit, wherein the rate is determined independent of an output voltage of the comparator circuit.

7. The method of claim 6, wherein a magnitude of the load voltage is greater than or equal to the first magnitude during the first time period, and wherein the magnitude of the load voltage is less than the second magnitude during the second time period.

8. The method of claim 7, further comprising, during the first time period, maintaining the set point voltage at the second magnitude via the diode after the set point voltage is reduced to the second magnitude.

9. The method of claim 6, wherein the rate is equal to a product of two parts, wherein one of the two parts corresponds to a ratio between a product of a first resistance value of a first resistor of the reference voltage circuit and a second resistance value of a second resistor of the reference voltage circuit and a sum of the first resistance value and the second resistance value, and wherein the other of the two parts corresponds to a capacitance value of the capacitor.

10. The method of claim 6, wherein the rate is further determined via a first resistor and a second resistor coupled to the first resistor.

11. The method of claim 6, wherein reducing the set point voltage to the second magnitude via the diode including changing an operation state of the diode to a forward bias operation state via the output voltage.

12. A detection circuit comprising:
a comparator circuit including:
a first input terminal;
a second input terminal to receive a load voltage from a load circuit; and
an output terminal;
a reference voltage circuit to provide a set point voltage having a first magnitude to the comparator circuit via the first input terminal, wherein the reference voltage circuit includes:
a first resistor including a first terminal and a second terminal, wherein the first terminal is coupled to a voltage source;
a second resistor including a third terminal and a fourth terminal, wherein the third terminal is coupled to the second terminal; and
a capacitor including a fifth terminal and a sixth terminal, wherein the fifth terminal is coupled to the third terminal, and wherein the sixth terminal is coupled to the fourth terminal; and
a diode to reduce the set point voltage from the first magnitude to a second magnitude when the first magnitude is equal to or lower than a magnitude of the load voltage.

13. The detection circuit of claim 12, the reference voltage circuit to increase the set point voltage from the second magnitude to the first magnitude at a rate equal to a product of two parts, wherein one of the two parts corresponds to a ratio between a first resistance value of the first resistor and a second resistance value of the second resistor, and wherein the other of the two parts corresponds to a capacitance value of the capacitor.

14. The detection circuit of claim 12, wherein the diode is in a forward bias operation state when the load voltage is equal to or greater than the set point voltage, and wherein the diode is in a reverse bias operation state when the load voltage is less than the set point voltage.

15. The detection circuit of claim 12, the comparator circuit to assert an output voltage having a particular magnitude via the output terminal coupled to the load circuit, wherein an operation state of a part of the load circuit is determined based on the output voltage.

* * * * *